(12) United States Patent
Holma et al.

(10) Patent No.: US 9,466,891 B2
(45) Date of Patent: Oct. 11, 2016

(54) CIRCUIT BOARD

(71) Applicant: TELLABS OY, Espoo (FI)

(72) Inventors: Antti Holma, Espoo (FI); Juha Sarapelto, Kirkkonummi (FI)

(73) Assignee: CORIANT OY, Espoo (FI)

( * ) Notice: Subject to any disclaimer, the term of this patent is extended or adjusted under 35 U.S.C. 154(b) by 24 days.

(21) Appl. No.: 14/505,621

(22) Filed: Oct. 3, 2014

(65) Prior Publication Data

US 2015/0096796 A1    Apr. 9, 2015

(51) Int. Cl.
| | |
|---|---|
| H01R 4/02 | (2006.01) |
| H05K 1/18 | (2006.01) |
| H05K 1/11 | (2006.01) |
| H05K 1/02 | (2006.01) |

(52) U.S. Cl.
CPC ............ *H01R 4/021* (2013.01); *H05K 1/0201* (2013.01); *H05K 1/115* (2013.01); *H05K 1/116* (2013.01); *H05K 1/181* (2013.01); *H05K 2201/062* (2013.01); *H05K 2201/0969* (2013.01); *H05K 2201/09718* (2013.01)

(58) Field of Classification Search
CPC ....... H01R 4/021; H05K 1/115; H05K 1/181
USPC ......................................... 174/262
See application file for complete search history.

(56) References Cited

U.S. PATENT DOCUMENTS 5,363,280 A * 11/1994 Chobot ................ H05K 1/0201
174/266
6,448,509 B1 * 9/2002 Huemoeller ........ H01L 21/4857
174/262
2003/0006061 A1 * 1/2003 Brinthaupt, III ..... H05K 1/0201
174/255
2007/0102490 A1 * 5/2007 Momokawa ......... H05K 1/0201
228/101
2012/0105096 A1 * 5/2012 Kuah ................. G01R 31/2812
324/763.01

FOREIGN PATENT DOCUMENTS

| EP | 0621747 A2 | 10/1994 |
| JP | 098443 A | 1/1997 |

OTHER PUBLICATIONS

Finnish Search Report, dated May 15, 2014, from corresponding FI application.

* cited by examiner

*Primary Examiner* — Timothy Thompson
*Assistant Examiner* — Charles Pizzuto
(74) *Attorney, Agent, or Firm* — Young & Thompson

(57) ABSTRACT

A circuit board comprises one or more first electrical conductors (102-107) in a first portion of the thickness of the circuit board, one or more second electrical conductors (108, 109) in a second portion of the circuit board, at least one via-conductor (112) providing a galvanic current path between the first and second electrical conductors, a hole extending through the first and second portions of the circuit board, and an electrically conductive sleeve (114) lining the hole and having galvanic contacts with the second electrical conductors. The thermal resistance from the electrically conductive sleeve to the first electrical conductors is greater than the thermal resistance from the electrically conductive sleeve to the second electrical conductors so as to obtain a reliable solder joint between a part of the electrically conductive sleeve belonging to the first portion of the circuit board and an electrical conductor pin (119) located in the hole.

8 Claims, 4 Drawing Sheets

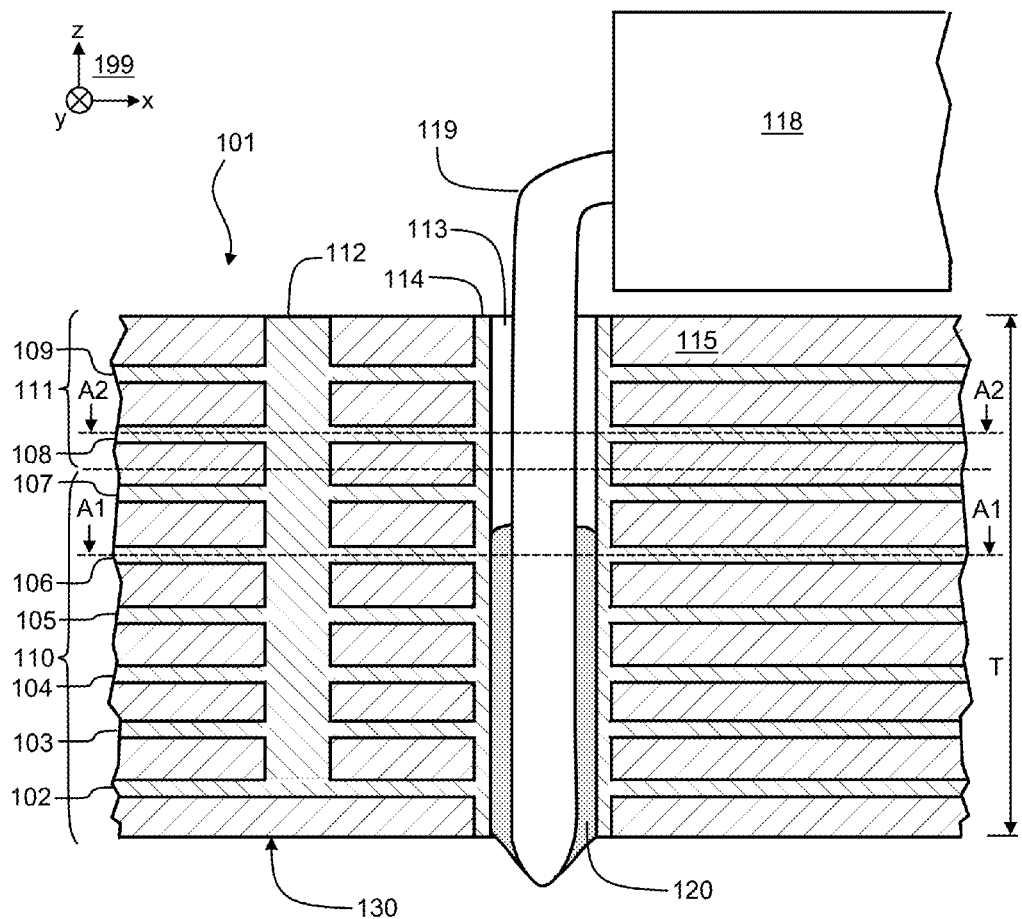
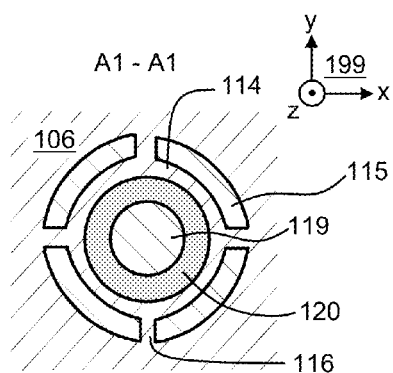
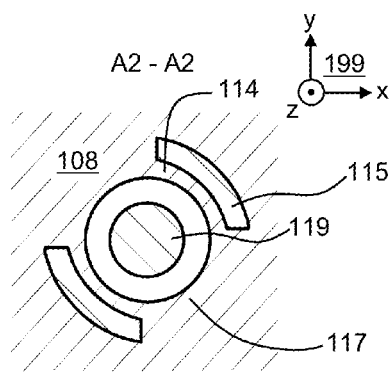
Figure 1a
Figure 1b    Figure 1c

CIRCUIT BOARD

FIELD OF THE INVENTION

The invention relates to a circuit board and to a circuit board system that comprises a circuit board furnished with one or more electrical components.

BACKGROUND

Many electronic devices comprise a circuit board and one or more electrical components having conductor feet protruding through holes of the circuit board. The holes of the circuit board are lined with electrically conductive sleeves that have galvanic contacts with appropriate other electrical conductors of the circuit board. The conductor feet of the electrical components are connected to electrical conductors of the circuit board by soldering so that the holes of the circuit board are at least partially filled with soldering material. The soldering can be carried out, for example, as a wave soldering where a wave of molten soldering material is arranged to sweep the side of the circuit board opposite to the side where of the electrical components are located.

In order to provide a reliable solder joint between a conductor foot of an electrical component and an electrically conductive sleeve in a hole of a circuit board, the temperatures of both the conductor foot and the electrically conductive sleeve have to be high enough when the molten soldering material is let to be absorbed into the hole of the circuit board. Otherwise there is a considerable risk for a forming a faulty "cold" solder joint. An inherent challenge related to the soldering is constituted by the thermal conductivity of the electrical conductors of the circuit board because temperature gradients in the electrical conductors tend to flatten, and this phenomenon lowers the temperature of the electrically conductive sleeve which is in contact with the soldering material. Typically, this problem is pursued to be solved by arranging the electrical conductors connected to the electrically conductive sleeve to form narrow isthmuses which are connected to the electrically conductive sleeve so as to decrease the heat conduction from the electrically conductive sleeve. However, these isthmuses must not be too narrow and/or too long because narrowing and/or lengthening the isthmuses increases electrical resistances between the electrically conductive sleeve and the one or more electrical conductors connected to the electrically conductive sleeve. Thus, there is an inherent trade-off between the thermal conductivity and the electrical resistances, and thereby there is a need for new technical solutions for providing reliable solder joints.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new circuit board that comprises:

at least one first electrical conductor in a first portion of the circuit board, the first portion of the circuit board encompassing a portion of the circuit board in the direction perpendicular to the circuit board, at least one second electrical conductor in a second portion of the circuit board, the second portion being abutted on the first portion in the direction perpendicular to the circuit board, at least one electrical via-conductor providing a galvanic current path between the at least one first electrical conductor and the at least one second electrical conductor, a hole extending through the first and second portions of the circuit board in the direction perpendicular to the circuit board, and an electrically conductive sleeve lining the hole and having a galvanic contact with the at least one second electrical conductor.

The thermal resistance from the electrically conductive sleeve to the at least one first electrical conductor is arranged to be greater than the thermal resistance from the electrically conductive sleeve to the at least one second electrical conductor so that the at least one first electrical conductor is configured to form one or more first isthmuses having galvanic contacts with the electrically conductive sleeve and the at least one second electrical conductor is configured to form one or more second isthmuses having galvanic contacts with the electrically conductive sleeve, and the electrical and thermal resistances of the first isthmuses are greater than those of the second isthmuses.

As the thermal resistance between the electrically conductive sleeve and the at least one first electrical conductor is greater, it is easier to obtain a reliable solder joint between a part of the electrically conductive sleeve belonging to the first portion of the circuit board and an elongated electrical conductor element located in the hole, e.g. a conductor foot of an electrical component. On the other hand, the second portion of the circuit board, where the thermal resistance and thereby the electrical resistance are smaller, can be arranged to provide good electrical connections between the electrically conductive sleeve and the at least one second electrical conductor. A sufficiently low electrical resistance from the electrically conductive sleeve to the at least one first electrical conductor can be provided with the aid of the above-mentioned electrical via-conductor providing the galvanic current path between the at least one first electrical conductor and the at least one second electrical conductor. Thus, the inherent and troublesome trade-off between the reliability of the solder joint and the electrical properties can be overcome or at least mitigated.

In accordance with the invention, there is provided also a new circuit board system that comprises:

a circuit board according to the invention, an electrical component having an electrical conductor foot extending through the hole of the circuit board, and soldering material in the hole and providing a galvanic connection between the electrical conductor foot of the electrical component and at least the part of the electrically conductive sleeve belonging to the first portion of the circuit board.

The circuit board system can be, for example but not necessarily, a part of telecommunication equipment and the circuit board system may comprise a processing system for supporting one or more of the following data transfer protocols: Internet Protocol "IP", Ethernet protocol, Multi-Protocol Label Switching "MPLS" protocol, and/or Asynchronous Transfer Mode "ATM".

A number of non-limiting and exemplifying embodiments of the invention are described in accompanied dependent claims.

Various non-limiting and exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

The exemplifying embodiments of the invention and their advantages are explained in greater detail below in the sense of examples and with reference to the accompanying drawings, in which:

FIGS. 1a-1c illustrate a part of a circuit board and a part of a circuit board system according to an exemplifying embodiment of the invention, FIGS. 3a-3d illustrate a part of a circuit board and a part of a circuit board system according to an exemplifying embodiment of the invention.

DESCRIPTION OF EXEMPLIFYING EMBODIMENTS

Figure 2A:
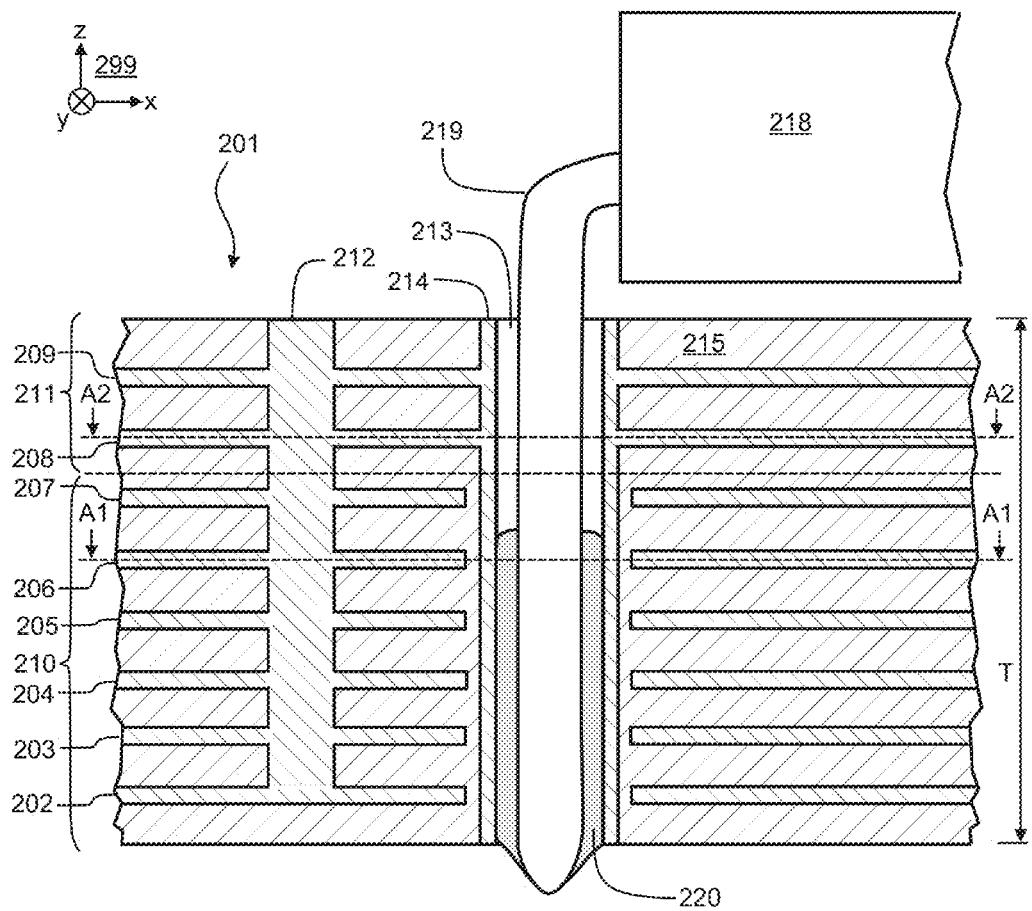
FIGS. 2a-2c illustrate a part of a circuit board and a part of a circuit board system according to an exemplifying embodiment of the invention.

FIG. 1a shows a section view of a part of a circuit board 101 according to an exemplifying embodiment of the invention. Furthermore, FIG. 1a illustrates a part of a circuit board system according to an exemplifying embodiment of the invention. The section shown in FIG. 1a has been taken along a plane parallel with the xz-plane of a coordinate system 199. FIG. 1b shows a part of a section taken along a line A1-A1 shown in FIG. 1a, and FIG. 1c shows a part of a section taken along a line A2-A2 shown in FIG. 1a. The circuit board 101 comprises first electrical conductors 102, 103, 104, 105, 106, and 107 in a first portion 110 of the circuit board. The first portion 110 of the circuit board is continuous in the direction perpendicular to the circuit board as illustrated in FIG. 1a. The circuit board 101 comprises second electrical conductors 108 and 109 in a second portion 111 of the circuit board. The second portion 111 is abutted on the first portion 110 in the direction perpendicular to the circuit board as illustrated in FIG. 1a. The direction perpendicular to the circuit board is parallel with the z-axis of the coordinate system 199. The circuit board 101 comprises electrically insulating material 115 that supports the electrical conductors 102-109. The circuit board 101 comprises at least one electrical via-conductor 112 providing galvanic current paths between the electrical conductors 102-109. The circuit board 101 comprises a hole 113 extending through the first and second portions 110 and 111 of the circuit board in the direction perpendicular to the circuit board. The hole 113 is lined with an electrically conductive sleeve 114 that has galvanic contacts with the electrical conductors 102-109. The thermal resistance from the electrically conductive sleeve 114 to each the electrical conductors 102-107 is greater than the thermal resistance from the electrically conductive sleeve to each of the electrical conductors 108 and 109. In other words, the thermal conductivity from the electrically conductive sleeve 114 to each the electrical conductors 102-107 is smaller than the thermal conductivity from the electrically conductive sleeve to each of the electrical conductors 108 and 109. The thermal resistance of a physical object can be defined as a ratio $\Delta T/P$, where $\Delta T$ is the temperature difference between the ends of the physical object and P is the power of the heat flow through the physical object. The section view shown in FIG. 1b illustrates that the electrically conductive sleeve 114 is connected to the electrical conductor 106 with four isthmuses one of which is denoted with a reference number 116 in FIG. 1b. Correspondingly, the section view shown in FIG. 1c illustrates that the electrically conductive sleeve 114 is connected to the electrical conductor 108 with two isthmuses one of which is denoted with a reference number 117 in FIG. 1c. As seen from FIGS. 1b and 1c, the thermally conductive area constituted by the four isthmuses shown in FIG. 1b is significantly smaller than the thermally conductive area constituted by the two isthmuses shown in FIG. 1c. In this exemplifying case it is assumed that the thickness of the isthmuses shown in FIG. 1b is substantially the same as the thickness of the isthmuses shown in FIG. 1c. The above-mentioned thicknesses of the isthmuses are measured in the z-direction of the coordinate system 199. Therefore, the thermal resistance from the electrically conductive sleeve 114 to the electrical conductor 106 is greater than the thermal resistance from the electrically conductive sleeve to the electrical conductor 108.

The circuit board system a part of which is illustrated in FIG. 1a comprises, in addition to the circuit board 101, an electrical component 118 having an electrical conductor foot 119 extending through the hole 113 of the circuit board, and soldering material 120 in the hole 113. The soldering material provides a galvanic connection between the electrical conductor foot 119 and the electrically conductive sleeve 114. Typically the soldering material 120 is metal alloy which comprises mainly tin and other metals as smaller shares. The composition of the soldering material can be for example Sn 96.5%-Ag 3%-Cu 0.5% or Sn 99.3%-Cu 0.7%. The soldering can be carried out, for example, as a wave soldering where a wave of molten soldering material is arranged to sweep the side of the circuit board 101 opposite to the side where of the electrical component 118 is located.

As the thermal resistances between the electrically conductive sleeve 114 and the electrical conductors 102-107 are greater, it is easier to obtain a reliable solder joint between the conductor foot 119 and the part of the electrically conductive sleeve 114 belonging to the first portion 110 of the circuit board because the greater thermal resistances inhibit the conduction of heat used in the soldering process from the electrically conductive sleeve 114 to the electrical conductors 102-107. On the other hand, the second portion 111 of the circuit board, where the corresponding thermal resistances and thereby the electrical resistances are smaller, can be arranged to provide good electrical connections between the electrically conductive sleeve 114 and the electrical conductors 108 and 109. Sufficiently low electrical resistances from the electrically conductive sleeve 114 to the electrical conductors 102-107 are achieved with the aid of the electrical via-conductor 112 providing the galvanic current paths between the electrical conductors 102-109.

In the exemplifying case illustrated in FIGS. 1a-1c, the first portion 110 of the circuit board covers about 65% of the thickness T of the circuit board.

In a circuit board according to an exemplifying embodiment of the invention, the first portion 110 of the circuit board covers at least 50% of the thickness of the circuit board.

In a circuit board according to an exemplifying embodiment of the invention, the first portion 110 of the circuit board covers at least 75% of the thickness of the circuit board.

Figure 2B:
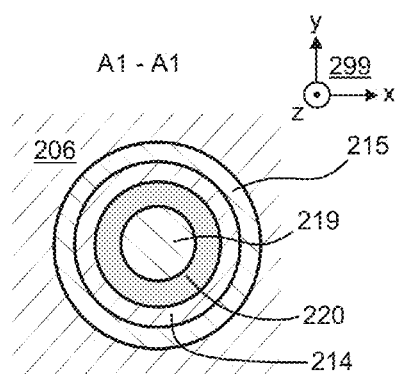
Figure 2C:
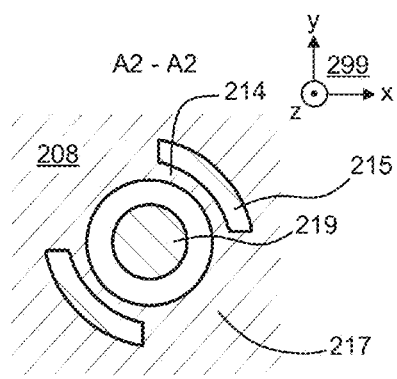

FIG. 2a shows a section view of a part of a circuit board 201 according to an exemplifying embodiment of the invention. Furthermore, FIG. 2a illustrates a part of a circuit board system according to an exemplifying embodiment of the invention. The section shown in FIG. 2a has been taken along a plane parallel with the xz-plane of a coordinate system 299. FIG. 2b shows a part of a section taken along a line A1-A1 shown in FIG. 2a, and FIG. 2c shows a part of a section taken along a line A2-A2 shown in FIG. 2a. The circuit board 201 comprises first electrical conductors 202, 203, 204, 205, 206, and 207 in a first portion 210 of the circuit board. The circuit board 201 comprises second electrical conductors 208 and 209 in a second portion 211 of the circuit board. The circuit board 201 comprises electrically insulating material 215 that supports the electrical conductors 202-209. The circuit board 201 comprises at least one electrical via-conductor 212 providing galvanic current paths between the electrical conductors 202-209. The circuit board 201 comprises a hole 213 extending through the first and second portions 210 and 211 of the circuit board in the direction perpendicular to the circuit board. The hole 213 is lined with an electrically conductive sleeve 214. The thermal resistance from the electrically conductive sleeve 214 to each of the electrical conductors 202-207 is greater than the thermal resistance from the electrically conductive sleeve 214 to each of the electrical conductors 208 and 209. The section view shown in FIG. 2b illustrates that the electrically conductive sleeve 214 is a distance apart from the electrical conductor 206. The section view shown in FIG. 2c illustrates that the electrically conductive sleeve 214 is connected to the electrical conductor 208 with two isthmuses one of which is denoted with a reference number 217 in FIG. 2c. As seen from FIGS. 2b and 2c, the thermal resistance from the electrically conductive sleeve 214 to the electrical conductor 206 is greater than the thermal resistance from the electrically conductive sleeve to the electrical conductor 208.

The circuit board system a part of which is illustrated in FIG. 2a comprises, in addition to the circuit board 201, an electrical component 218 having an electrical conductor foot 219 extending through the hole 213 of the circuit board, and soldering material 220 in the hole 213. The soldering material 220 provides a galvanic connection between the electrical conductor foot 219 and the electrically conductive sleeve 214.

In the exemplifying case illustrated in FIGS. 1a-1c, the first portion 110 of the circuit board 101 comprises a surface 130 of the circuit board on an opposite side of the circuit board with respect to the location of the electrical component 118. The same is valid also in conjunction with the exemplifying case illustrated in FIGS. 2a-2c. This is, however, not the only possible choice as illustrated below with reference to FIGS. 3a, 3b, 3c and 3d.

Figure 3B:
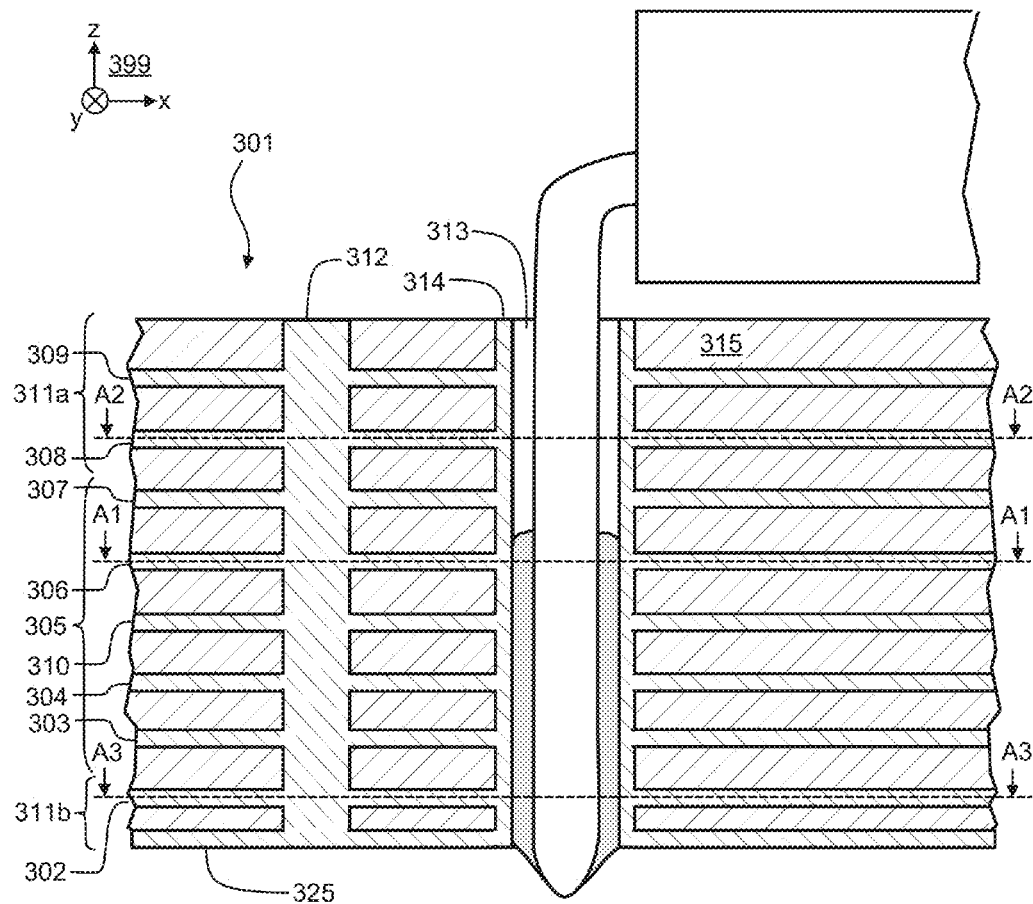
Figure 3B:
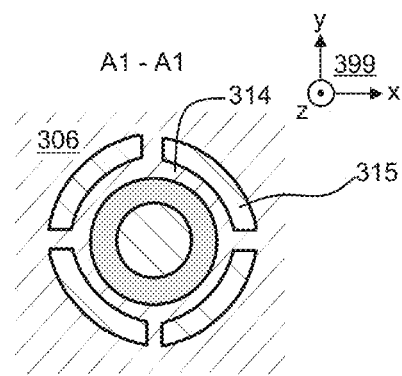
Figure 3C:
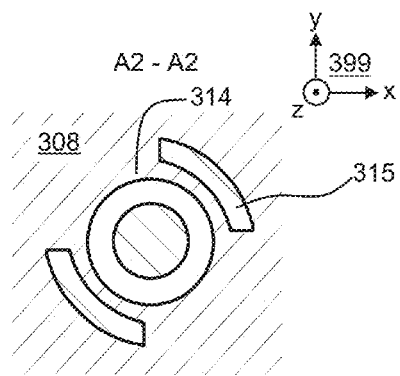
Figure 3D:
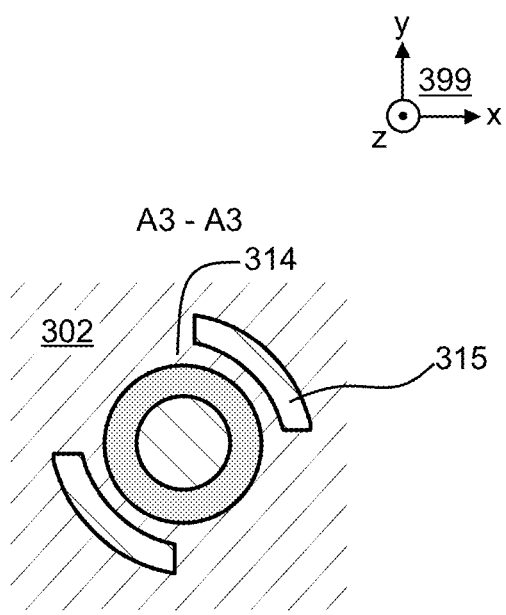

FIG. 3a shows a section view of a part of a circuit board 301 according to an exemplifying embodiment of the invention. Furthermore, FIG. 3a illustrates a part of a circuit board system according to an exemplifying embodiment of the invention. The section shown in FIG. 3a has been taken along a plane parallel with the xz-plane of a coordinate system 399. FIG. 3b shows a part of a section taken along a line A1-A1 shown in FIG. 3a, FIG. 3c shows a part of a section taken along a line A2-A2 shown in FIG. 3a, and FIG. 3d shows a part of a section taken along a line A3-A3 shown in FIG. 3a. The circuit board 301 comprises first electrical conductors 303, 304, 305, 306, and 307 in a first portion 310 of the circuit board. The circuit board 301 comprises second electrical conductors 302, 325, 308 and 309 in a second portion of the circuit board. In this exemplifying case, the second portion comprises two separate sub-portions 311a and 311b so that the first portion 310 is between these sub-portions 311a and 311b as illustrated in FIG. 3a. The circuit board 301 comprises electrically insulating material 315 that supports the electrical conductors 302-309 and 325. The circuit board 301 comprises at least one electrical via-conductor 312 providing galvanic current paths between the electrical conductors 302-309 and 325. The circuit board 301 comprises a hole 313 extending through the portions 310, 311a and 311b of the circuit board in the direction perpendicular to the circuit board. The hole 313 is lined with an electrically conductive sleeve 314 that has galvanic contacts with the electrical conductors 302-309 and 325. The thermal resistance from the electrically conductive sleeve 314 to each of the electrical conductors 303-307 is greater than the thermal resistance from the electrically conductive sleeve to each of the electrical conductors 302, 325, 308 and 309. The section view shown in FIG. 3b illustrates that the electrically conductive sleeve 314 is connected to the electrical conductor 306 with four isthmuses. Correspondingly, the section views shown in FIGS. 3c and 3d illustrate that the electrically conductive sleeve 314 is connected to the electrical conductor 308 with two isthmuses and to the electrical conductor 302 with two isthmuses. In this exemplifying case it is assumed that the thicknesses of the isthmuses shown in FIGS. 3b, 3c and 3d are substantially the same in the z-direction of the coordinate system 399. Therefore, the thermal resistance from the electrically conductive sleeve 314 to the electrical conductor 306 is greater than the thermal resistance from the electrically conductive sleeve to the electrical conductor 308 and greater than the thermal resistance from the electrically conductive sleeve to the electrical conductor 302.

The specific examples provided in the description given above should not be construed as limiting the applicability and/or the interpretation of the appended claims.

What is claimed is:

1. A circuit board comprising:
   at least one first electrical conductor in a first portion of the circuit board, the first portion of the circuit board encompassing a portion of the circuit board in a direction perpendicular to the circuit board,
   at least one second electrical conductor in a second portion of the circuit board, the second portion being abutted on the first portion in the direction perpendicular to the circuit board,
   at least one electrical via-conductor providing a galvanic current path between the at least one first electrical conductor and the at least one second electrical conductor,
   a hole extending through the first and second portions of the circuit board in the direction perpendicular to the circuit board, and
   an electrically conductive sleeve lining the hole and having a galvanic contact with the at least one second electrical conductor and with the at least one first electrical conductor,
wherein thermal resistance from the electrically conductive sleeve to the at least one first electrical conductor is greater than thermal resistance from the electrically conductive sleeve to the at least one second electrical conductor so as to facilitate obtaining a reliable solder joint between a part of the electrically conductive sleeve belonging to the first portion of the circuit board and an elongated electrical conductor element located in the hole, wherein the at least one first electrical conductor is configured to form one or more first isthmuses having galvanic contacts with the electrically conductive sleeve and the at least one second electrical conductor is configured to form one or more second isthmuses having galvanic contacts with the electrically conductive sleeve, electrical and thermal resistances of the first isthmuses being greater than electrical and thermal resistances of the second isthmuses.

2. A circuit board according to claim 1, wherein the electrically conductive sleeve is a distance apart from the at least one first electrical conductor, and there is a galvanic current path from the electrically conductive sleeve to the at least one first electrical conductor through the at least one second electrical conductor and through the electrical via-conductor.

3. A circuit board according to claim 1, wherein the first portion of the circuit board encompasses a surface of the circuit board.

4. A circuit board according to claim 1, wherein the first portion of the circuit board covers at least 50% of the thickness of the circuit board.

5. A circuit board according to claim 1, wherein the first portion of the circuit board covers at least 75% of the thickness of the circuit board.

6. A circuit board system comprising:
a circuit board comprising: (i) at least one first electrical conductor in a first portion of the circuit board, the first portion of the circuit board encompassing a portion of the circuit board in a direction perpendicular to the circuit board, (ii) at least one second electrical conductor in a second portion of the circuit board, the second portion being abutted on the first portion in the direction perpendicular to the circuit board, (iii) at least one electrical via-conductor providing a galvanic current path between the at least one first electrical conductor and the at least one second electrical conductor, (iv) a hole extending through the first and second portions of the circuit board in the direction perpendicular to the circuit board, and (v) an electrically conductive sleeve lining the hole and having a galvanic contact with the at least one second electrical conductor and with the at least one first electrical conductor,
an electrical component having an electrical conductor foot extending through the hole of the circuit board, and
soldering material in the hole of the circuit board and providing a galvanic connection between the electrical conductor foot of the electrical component and at least the part of the electrically conductive sleeve belonging to the first portion of the circuit board,
wherein thermal resistance from the electrically conductive sleeve to the at least one first electrical conductor is greater than thermal resistance from the electrically conductive sleeve to the at least one second electrical conductor so as to facilitate obtaining a reliable solder joint between a part of the electrically conductive sleeve belonging to the first portion of the circuit board and an elongated electrical conductor element located in the hole, wherein the at least one first electrical conductor is configured to form one or more first isthmuses having galvanic contacts with the electrically conductive sleeve and the at least one second electrical conductor is configured to form one or more second isthmuses having galvanic contacts with the electrically conductive sleeve, electrical and thermal resistances of the first isthmuses being greater than electrical and thermal resistances of the second isthmuses.

7. A circuit board system according to claim 6, wherein the first portion of the circuit board comprises a surface of the circuit board on an opposite side of the circuit board with respect to location of the electrical component.

8. A circuit board system according to claim 6, wherein the circuit board system comprises a processing system for supporting at least one of the following data transfer protocols: Internet Protocol "IP", Ethernet protocol, Multi-Protocol Label Switching "MPLS" protocol, Asynchronous Transfer Mode "ATM".

* * * * *

UNITED STATES PATENT AND TRADEMARK OFFICE
CERTIFICATE OF CORRECTION

PATENT NO. : 9,466,891 B2  
APPLICATION NO. : 14/505621  
DATED : October 11, 2016  
INVENTOR(S) : Antti Holma et al.

Page 1 of 1

It is certified that error appears in the above-identified patent and that said Letters Patent is hereby corrected as shown below:

On the Title Page

Please add Item (30) to read as follows:

-- (30) Foreign Application Priority Data

October 4, 2013 (FI).................................................20135993 --

Signed and Sealed this  
Seventh Day of February, 2017

Michelle K. Lee  
*Director of the United States Patent and Trademark Office*